(12) United States Patent
Hool et al.

(10) Patent No.: US 7,276,399 B1
(45) Date of Patent: Oct. 2, 2007

(54) METHOD OF DESIGNING A MODULE-BASED FLIP CHIP SUBSTRATE DESIGN

(75) Inventors: Vincent Hool, Fremont, CA (US); John Yuanlin Xie, Fremont, CA (US)

(73) Assignee: Altera Corporation, San Jose, CA (US)

( * ) Notice: Subject to any disclaimer, the term of this patent is extended or adjusted under 35 U.S.C. 154(b) by 164 days.

(21) Appl. No.: 10/783,608

(22) Filed: Feb. 19, 2004

(51) Int. Cl.
*H01L 21/00* (2006.01)
*H01L 23/48* (2006.01)
*H05K 7/00* (2006.01)

(52) U.S. Cl. ............ 438/125; 438/612; 361/777; 257/786

(58) Field of Classification Search .......... None
See application file for complete search history.

(56) References Cited

U.S. PATENT DOCUMENTS

| | | | |
|---|---|---|---|
| 5,200,580 A * | 4/1993 | Sienski | 174/264 |
| 5,691,568 A * | 11/1997 | Chou et al. | 257/691 |
| 5,877,942 A * | 3/1999 | Kida et al. | 361/777 |
| 6,225,143 B1 * | 5/2001 | Rao et al. | 438/106 |
| 6,319,752 B1 * | 11/2001 | Tain et al. | 438/110 |
| 6,569,694 B1 * | 5/2003 | Sarma et al. | 438/14 |
| 2005/0138584 A1 * | 6/2005 | Beattie et al. | 716/5 |
| 2005/0278674 A1 * | 12/2005 | Bhatia et al. | 716/8 |

OTHER PUBLICATIONS

Zuken Be First, "Hot-Stage 4.1", www.zuken.com.
Cadence, "PCB Design Studio, Cadence PCB Design Tools and the Latest Technology at a Breakthrough Price", 2003 Cadence Design Systems, Inc., www.cadence.com.
Cadence, "PCB Design Expert, High-Speed, Contrraint-Driven PCB Design", 2003 Cadence Design Systems, Inc., www.cadence.com.
Mentor Graphics, "Destiny RE for Cadence Allegro", 2003 Mentor Graphics Corporation.

* cited by examiner

*Primary Examiner*—Alonzo Chambliss
(74) *Attorney, Agent, or Firm*—Beyer Weaver LLP

(57) ABSTRACT

Methods and apparatus are provided for designing the electrical interconnects of a substrate. Modules are used to design sections of the electrical interconnects. Multiple modules may be interconnected to generate the electrical interconnects. The placement of modules and/or the interconnection of the modules may depend on a netlist and/or a separate report. Modules may even be defined by various constraints. Accordingly, a module based design may be implemented for efficiently and effectively producing a standardized electrical interconnect design.

28 Claims, 5 Drawing Sheets

METHOD OF DESIGNING A MODULE-BASED FLIP CHIP SUBSTRATE DESIGN

BACKGROUND

1. Field of the Invention

The present invention relates to software tools for facilitating packaging design. More specifically, the present invention relates to a design methodology that employs a software design tool to generate a module based substrate design.

2. Description of the Prior Art

In a semiconductor device package, a semiconductor chip (also referred to as an integrated circuit (IC) chip or "die") may be bonded directly to a substrate. Such a die is formed with ball-shaped beads or bumps of solder affixed to its I/O (input/output) pads. During packaging, the die is "flipped" onto its front surface (e.g., active surface) so that the bumps form electrical connections between the die and conductive electrical pads on a substrate. A semiconductor device package of this type is commonly called a "flip chip package".

Generally, the substrate includes a complex design of electrical interconnects that electrically connect the conductive electrical pads on one side of the substrate with ball grid array (BGA) lands on another side of the substrate. Different routing approaches are currently used that affect the design of the electrical interconnects. One approach is to perform a manual interconnect routing that allows each designer to route the electrical interconnects such that routing density can be maximized. The design of the electrical interconnects is often left to the discretion and idiosyncrasies of the individual designer. Not only can this result in inconsistent design results between different designers with different levels of expertise, but it can also be time consuming.

In an attempt to standardize design results between different designers, another approach is to perform a constraint driven interconnect routing. Constraint driven interconnect routing applies certain electrical requirements to the routing of the electrical interconnects. Although constraint driven interconnect routing provides some standardization, it is often difficult to standardize throughout the electrical interconnects with the constraints. Furthermore, the results still depend on the individual designer's level of expertise.

Yet another approach is to use any number of commercially available software design tools to perform an auto interconnect routing. However, the use of auto interconnect routing is usually limited to very simple electrical interconnect designs where the results are often unpredictable. Moreover, routing density is usually not maximized. Thus, even though some exemplary automated design tools exist, there are still considerable inefficiency and ineffectiveness in the achieved results and in the way that designs are implemented.

Consequently, it is therefore desirable to provide improved methods and apparatus for designing the electrical interconnects of a substrate. More specifically, it is desirable to provide techniques and mechanisms for efficiently and effectively generating a standardized electrical interconnect design.

SUMMARY

Methods and apparatus are provided for designing the electrical interconnects of a substrate. In general, a module based design is implemented for producing a standardized electrical interconnect design.

One aspect of the present invention involves a method for designing a plurality of electrical paths in a substrate used for coupling to a die, wherein the substrate has a plurality of layers. The method includes: (1) receiving a report identifying end connection points for the plurality of electrical paths; (2) dividing the plurality of electrical paths into sections including a first end section, an intermediate section, and a second end section; (3) selecting cells for the first end section and the second end section, the cells being a first end cell and a second end cell; and (4) connecting the first end cell to the second end cell with transmission lines to form the plurality of electrical paths, the transmission lines corresponding to the intermediate section.

Generally, the report may identify which end connection points are interconnected. The report may also identify a set of coordinates that corresponds to a set of I/O pad locations on the die. In some cases, the report is a netlist. Typically, the first and second end sections include a portion of at least one electrical path that traverses the plurality of layers whereas the intermediate section includes a portion of at least one electrical path that traverses only one of the plurality of layers. The plurality of electrical paths may further include signal, power, and ground electrical paths. Moreover, the step of connecting may include automatically aligning the first end cell, transmission lines, and second end cell such that the first end, intermediate, and second end electrical paths form the electrical paths with corresponding end connection points that are consistent with the report.

Another aspect of the present invention involves a method for designing a plurality of electrical paths in a substrate used for coupling to a die, wherein the substrate having a plurality of layers. The method includes: (1) receiving a report identifying end connection points for the plurality of electrical paths and identifying a set of coordinates that correspond to a set of I/O pad locations on the die, the set of coordinates being relative to the die, the plurality of electrical paths including signal, power, and ground electrical paths; (2) dividing the plurality of electrical paths into three sections including a first end section, an intermediate section, and a second end section; (3) selecting a first end cell and a second end cell associated with the first and second end sections, wherein the first end cell comprises a plurality of first end electrical paths defined by a common constraint, wherein each first end electrical path includes one of the end connection points that corresponds to the set of coordinates; and (4) connecting the first end and second end cells with transmission lines to form the plurality of electrical paths, the transmission lines corresponding with the intermediate section.

In one embodiment, the common constraint may be predefined. The common constraint may be selected based on one of the plurality of first end electrical paths having the greatest limitation on the common constraint. The common constraint may include an electrical parameter such as polarity, propagation delay, impedance, and RLC. The common constraint may also include a geometrical parameter such as electrical path spacing and electrical path thickness. Yet, the common constraint may include a set ratio of signal, power, or ground electrical paths amongst the plurality of first end electrical paths.

In another embodiment, the second end cell includes a plurality of second end electrical paths defined by a second common constraint, wherein each second end electrical path includes one of the end connection points that has a BGA coordinate relative to the set of coordinates. The second common constraint may be predefined. The second common constraint may be selected based on one of the plurality of second end electrical paths having the greatest limitation on the second common constraint. The second common constraint may include an electrical parameter such as polarity, propagation delay, impedance, and RLC. The second common constraint may also include a geometrical parameter such as electrical path spacing and electrical path thickness. Yet, the second common constraint may include a set ratio of signal, power, or ground electrical paths amongst the plurality of second end electrical paths.

In yet another embodiment, the transmission lines include a plurality of intermediate electrical paths defined by a third common constraint, wherein each intermediate electrical path is further defined by corresponding first end and second end electrical paths. The third common constraint may be predefined. The third common constraint may include a geometrical parameter such as electrical path spacing and electrical path thickness.

Another aspect of the present invention involves a semiconductor package having a die coupled to a substrate where the substrate is designed according to a method for designing a plurality of electrical paths in the substrate and where the substrate includes a plurality of layers. The method includes: (1) receiving a report identifying end connection points for the plurality of electrical paths; (2) dividing the plurality of electrical paths into sections including a first end section, an intermediate section, and a second end section; (3) selecting cells for the first end section and the second end section, the cells being a first end cell and a second end cell; and (4) connecting the first end cell to the second end cell with transmission lines to form the plurality of electrical paths, the transmission lines corresponding to the intermediate section.

Yet, another aspect of the invention pertains to computer program products including a machine readable medium on which is stored program instructions, tables or lists, and/or data structures for implementing a method as described above. Any of the methods, tables, or data structures of this invention may be represented as program instructions that can be provided on such computer readable media. Still other aspects relate to systems including a processor and memory for implementing a method as described above. Any of the method or techniques of this invention may be implemented on a system having a processor and memory.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

FIG. 1 illustrates a cross-sectional view of a semiconductor flip chip package for which the present invention can be applied to.

DETAILED DESCRIPTION

Introduction

Figure 1:
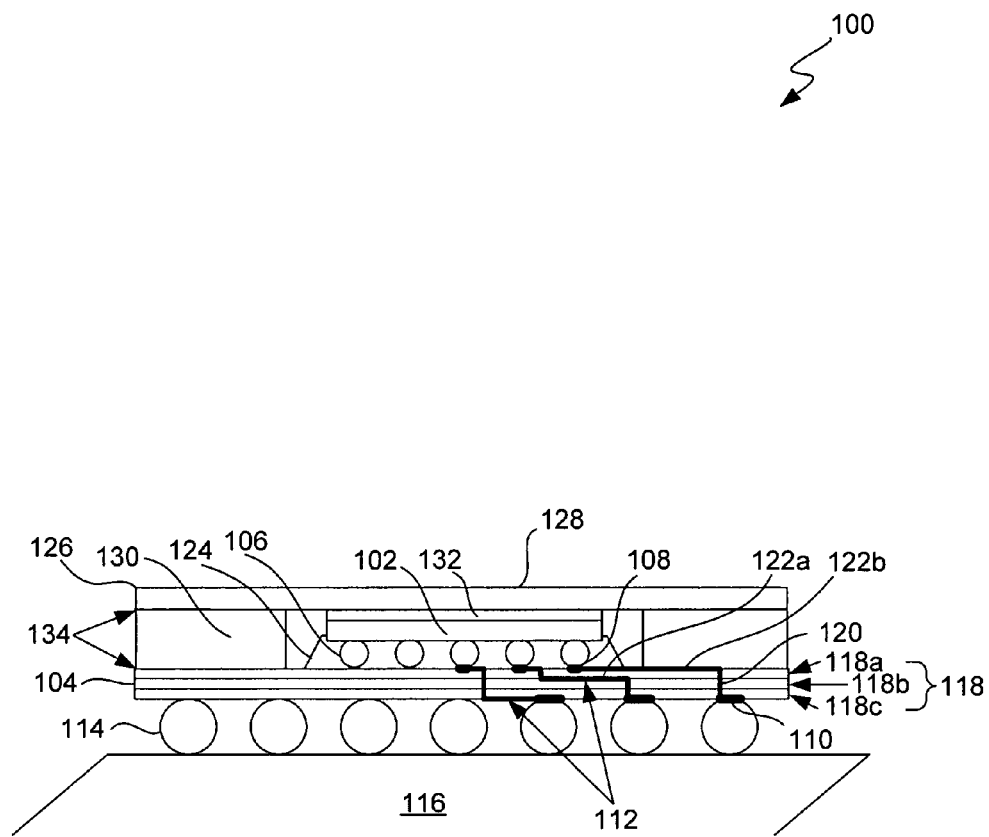

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In general, designing the electrical interconnects in a substrate for coupling to a die and board surface (e.g., printed circuit board) may be an overwhelming task. For instance, in order to produce electrical interconnects that complement the die and board surface for coupling to and for integrating with, numerous constraints must be considered. These constraints may include electrical and geometrical constraints that will define the characteristics (e.g., behavioral, performance, etc.) of the electrical interconnects. Furthermore, standardizing electrical interconnect designs between different designers with different experience levels must be considered. As such, the present invention generally provides techniques and mechanisms for efficiently and effectively producing a standardized electrical interconnect design.

Aspects of this invention provide a module based electrical interconnect design. In one example, methods and apparatus are provided for designing the electrical interconnects of a substrate. The design is partitioned into three sections: FC (flip chip) pad escape route, transmission line route, and BGA connection route. At least one FC pad module is selected for the FC pad escape route and defined/standardized by any number of constraints. At least one BGA connection module is selected for the BGA connection route and defined/standardized by any number of constraints. Worst-case scenario constraints may be used to further define both FC pad and BGA connection modules. Transmission lines for connecting the FC pad module with the BGA connection module are defined/standardized based on constraints as well. Placement of FC pad module and BGA connection module is respectively based on FC bump/IO pad and BGA ball coordinates whereas the connection (via transmission lines) between the FC pad module and BGA connection module is based on a netlist. Accordingly, a module based electrical interconnect design may be implemented for efficiently and effectively producing a standardized electrical interconnect design.

The present invention is advantageously applicable to any semiconductor device package (e.g., ASIC, FPGA), but is particularly applicable to semiconductor flip chip packages. For example, FIG. 1 illustrates a cross-sectional view of a semiconductor flip chip package 100 according to various embodiment of the present invention. As shown, semiconductor flip chip package 100 includes a die 102 that is attached to a corresponding substrate 104. In attaching die 102 to substrate 104, die 102 is positioned over substrate 104 and bonded electrically and mechanically together in a solder joining operation. It is important to note that the un-bonded die has an array of bumps 106 affixed to its I/O pads (not shown) and arranged on its active surface. Bumps 106 can be composed of any conductive material. However, high lead (95Pb5Sn) and eutectic (63Sn37Pb) solder are the most commonly used bump materials.

Prior to bonding die 102 to substrate 104, flux is applied to either die 102 or substrate 104. The flux serves primarily to allow solder to wet the joining surfaces, such that bumps 106 make good electrical contact with electrical pads 108 on substrate 104. After the flux is applied, die 102 is aligned with and placed onto a placement site on substrate 104 such that bumps 106 are aligned and in contact with electrical pads 108 on substrate 104. Electrical pads 108 are electrically connected to ball grid array (BGA) lands 110 via a plurality of electrical interconnects 112 within the substrate. BGA lands provide a location for which a BGA ball 114 may be formed to electrically connect the semiconductor flip chip package 100 to a board surface 116 (e.g., printed circuit board).

Substrate 104 is typically composed of an organic material, such as PTFE (such as Teflon™, available form Gore, Eau Claire, Wis.), bismaleimide triazine (BT) resin, and other epoxy. However, substrate 104 may also be composed of ceramic or ceramic-plastic materials. Any conventional method for fabricating substrate 104 may be used. For example, laminate and substantial build-up fabrication methods can be used. Generally, substrate 104 includes a plurality of layers 118 (e.g., 118(a-c)).

Due to the I/O density, routing of the electrical interconnects is done on several layers to avoid violating any spacing specifications. For instance, electrical interconnects 112 will traverse the plurality of layers in order to connect electrical pads 108 to BGA lands 110. In doing so, electrical interconnects 112 may have portions that traverse along a single layer (e.g., transmission lines 122a and 122b). As shown, transmission line 122b is on top layer 118a whereas transmission line 122a is on intermediate layer 118b. In addition, electrical interconnects 112 may have portions that traverse through different layers (e.g., via 120).

An underfill 124 can be optionally applied in order to enhance the mechanical bonding of the die and substrate. In one embodiment, underfill material 124, typically a thermoset epoxy, such as is available from Hysol Corporation of Industry, Calif. (e.g., product numbers 4549, 8439), Ablestik Laboratories of Rancho Domingo, Calif., or Namics, Reno, Nev. (e.g., product no. 8439-1) is dispensed into the remaining space (or "gap") between die 102 and substrate 104.

Semiconductor flip chip package 100 also may include a heat spreader 126 composed of a thermally conductive material. Heat spreader 126 may either be in a one-piece heat spreader construction or in a two-piece heat spreader construction (e.g., lid 128 and stiffener 130). That is, a heat spreader may be composed of a lid connected to the substrate via a stiffener or may also have a form that allows for direct attachment to the substrate, such as through edges or legs that descend from the flat piece overlying the die to contact the substrate. In either case, it is referred to herein as a heat spreader. In general, heat spreaders are made of metal. As shown in FIG. 1, heat spreader 126 is connected to the inactive surface of die 102 with a thermal adhesive material 132. The connection of the heat spreader to the substrate (and optionally the stiffener) is made with an adhesive 134.

Apparatus and Environment

Generally, embodiments of the present invention employ various processes or methods involving data stored in or transferred through one or more computing devices. Embodiments of the present invention also relate to an apparatus for performing these operations. Such apparatus may be specially constructed to implement an electrical interconnect design according to the techniques of the present invention, or it may be a general-purpose computer selectively activated or reconfigured by a computer program and/or data structure stored in the computer. The processes presented herein are not intrinsically related to any particular computer or other apparatus. Various general-purpose machines may be used with programs written in accordance with the teachings herein, or it may be more convenient to construct a more specialized apparatus to perform the required method operations. A particular structure generally representing a variety of these machines will be described below.

In addition, embodiments of the present invention relate to computer readable media or computer program products that include program instructions and/or data (including data structures) for performing various computer-implemented operations. Examples of computer-readable media include, but are not limited to, magnetic media such as hard disks, floppy disks, and magnetic tape; optical media such as CD-ROM disks; magneto-optical media; semiconductor memory devices, and hardware devices that are specially configured to store and perform program instructions, such as read-only memory devices (ROM) and random access memory (RAM). The data and program instructions of this invention may also be embodied on a carrier wave or other transport medium (including electronic or optically conductive pathways).

Examples of program instructions include low-level code, such as that produced by a compiler, as well as higher-level code that may be executed by the computer using an interpreter. Further, the program instructions may be machine code, source code and/or any other code that directly or indirectly controls operation of a computing machine in accordance with this invention. The code may specify input, output, calculations, conditionals, branches, iterative loops, etc.

Figure 2:
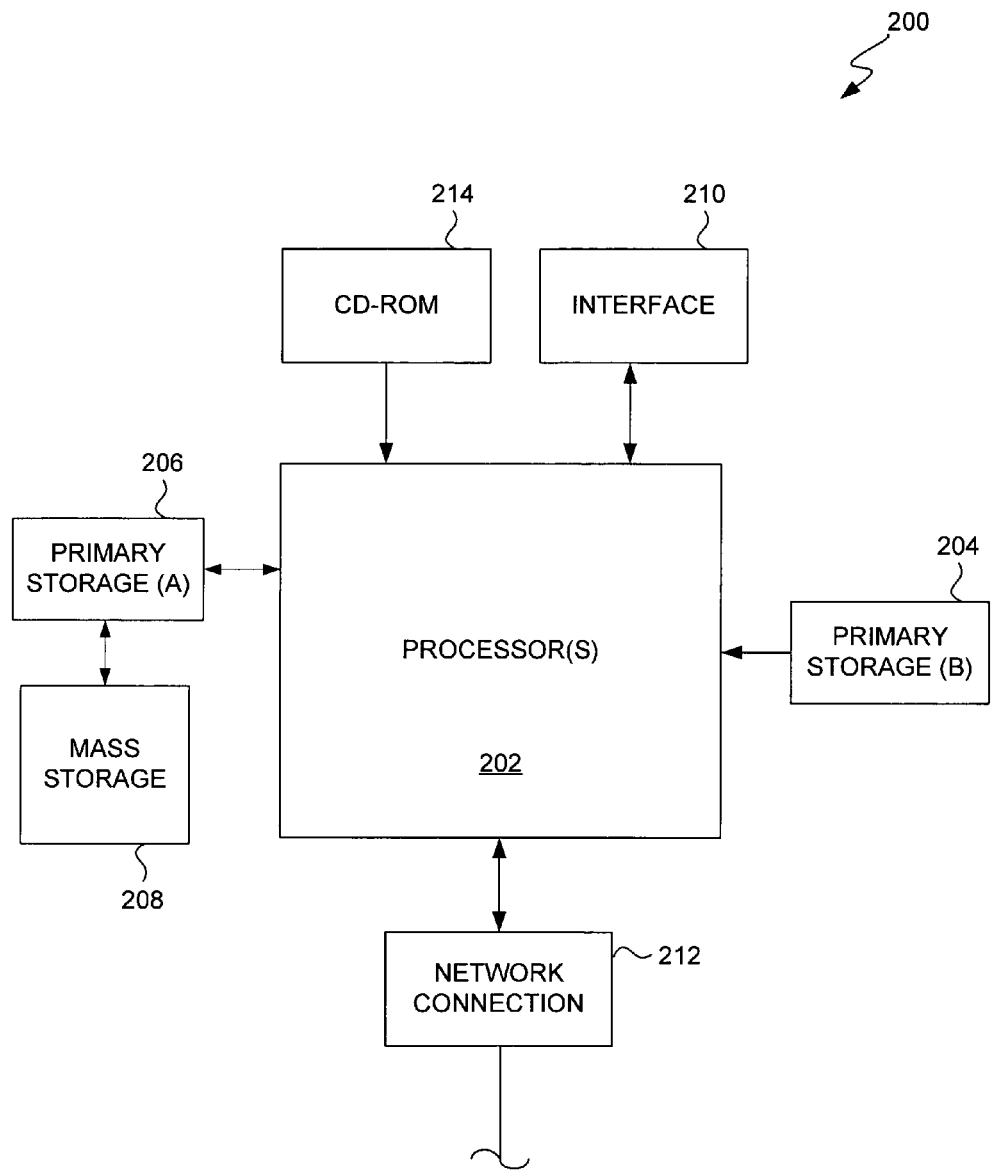
FIG. 2 illustrates a typical computer system that, when appropriately configured or designed, can serve as an apparatus of this invention.

FIG. 2 illustrates, in simple block format, a typical computer system that can serve as a computational apparatus for implementing a module based electrical interconnect design. The computer system 200 includes any number of processors 202 (also referred to as central processing units, or CPUs) that are coupled to storage devices including primary storage 206 (typically a random access memory, or RAM) and primary storage 204 (typically a read only memory, or ROM). In the depicted embodiment, primary storage 204 acts to transfer data and instructions uni-directionally to the CPU and primary storage 206 is used typically to transfer data and instructions in a bi-directional manner. Both of these primary storage devices may include any suitable computer-readable media such as those described above. A mass storage device 208 is also coupled bi-directionally to primary storage 206 and provides additional data storage capacity and may include any of the computer-readable media described above. Mass storage device 208 may be used to store programs, data and the like and is typically a secondary storage medium such as a hard disk. Frequently, such programs, data and the like are temporarily copied to primary memory 206 for execution on CPU 202. It will be appreciated that the information retained within the mass storage device 208, may, in appropriate cases, be incorporated in standard fashion as part of primary storage 204. A specific mass storage device such as a CD-ROM 214 may also pass data uni-directionally to the CPU or primary storage.

CPU 202 is also coupled to an interface 210 that connects to one or more input/output devices such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 202 optionally may be coupled to an external device such as a database or a computer or telecommunications network using an external connection as shown generally at 212. With such a connection, it is contemplated that the CPU might receive information from the network, or might output information to the network in the course of performing the method steps described herein.

Figure 3A:
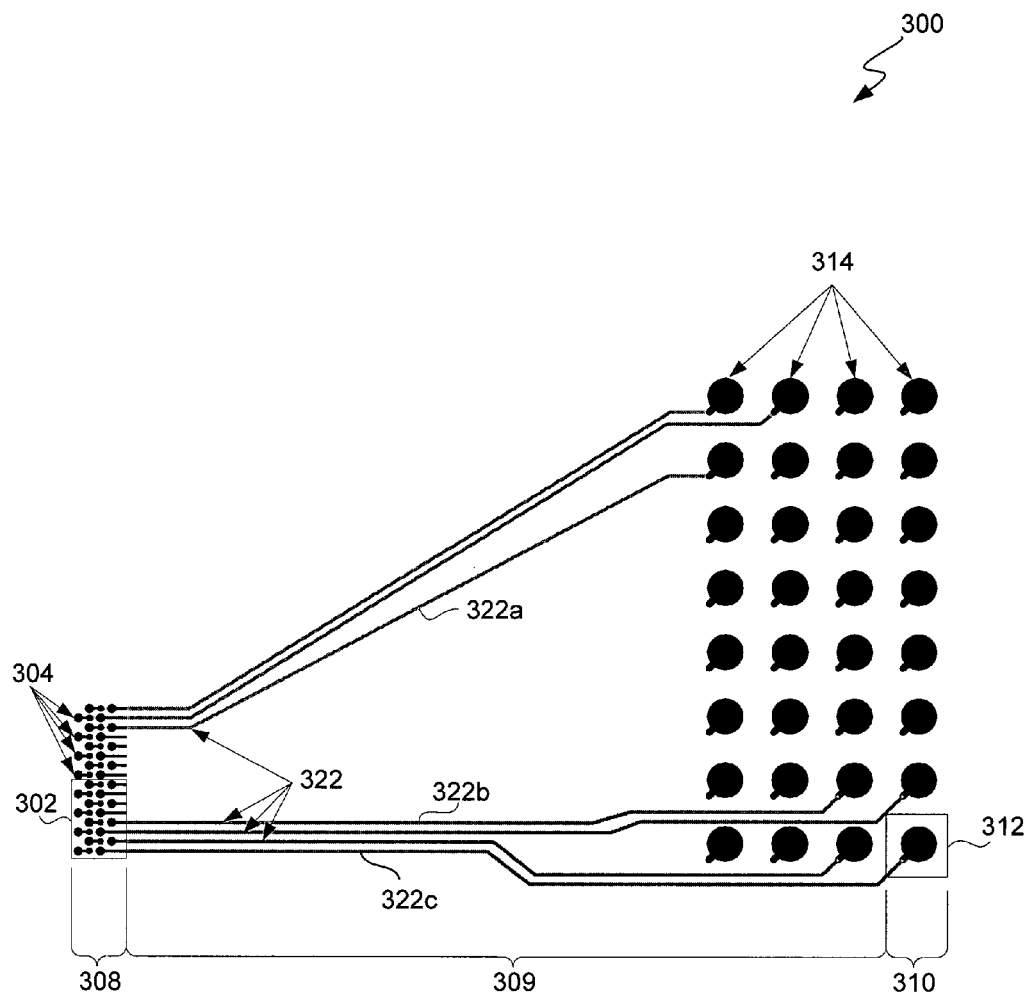
FIG. 3A illustrates a top view of an overall module based electrical interconnect design according to various embodiments of the present invention.

Exemplary Components for Designing a Plurality of Electrical Paths in a Substrate FIG. 3A illustrates a top view of an overall module based electrical interconnect design 300 according to various embodiments of the present invention. As shown, electrical pads 304 that correspond to the coordinates of the flip chip bumps/I/O pads are coupled to matching BGA lands 314 with transmission lines 322 (e.g., 322a, 322b, 322c). The entire connection between and including electrical pads 304 and BGA lands 314 represent the electrical path for which an electrical interconnect is routed and/or designed. In one embodiment, the electrical path is divided into three sections. For instance, referring to the electrical path that includes transmission line 322c, the divided three sections are an FC pad escape route 308, a transmission line route 309, and a BGA connection route 310. FC pad escape route 308 is associated with a FC pad module 302 whereas BGA connection route 310 is associated with a BGA connection module 312. In addition, transmission line route 309 is associated with transmission line 322.

Figure 3B:
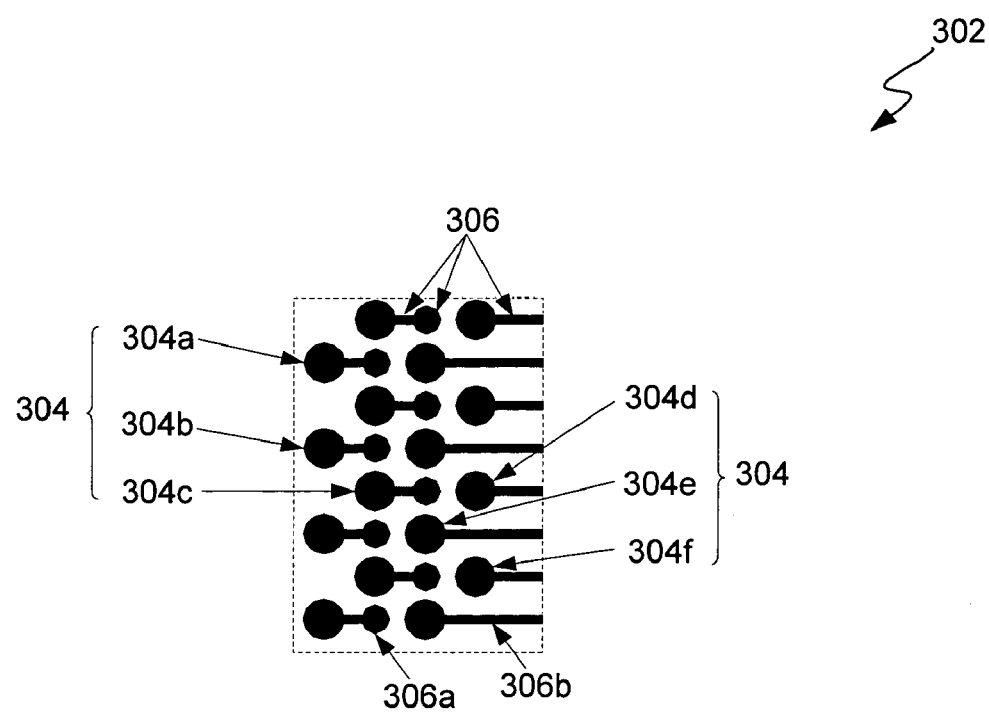
FIG. 3B illustrates a top view of a basic flip chip pad module according to various embodiments of the present invention.

FIG. 3B illustrates a top view of a basic flip chip pad module 302 according to various embodiments of the present invention. FC pad module 302 includes a portion of at least one electrical path having an electrical pad 304 (e.g., 304a, 304b, 304c) with an adjoining escape route 306 (e.g., 306a, 306b) that extends to the edge of the FC pad module 302 for connecting to a corresponding transmission line 322. Electrical pad 304 corresponds to coordinates of either a FC bump or a FC I/O pad location of a flip chip packaged die for placement of FC pad module 302. The coordinates are provided early in the electrical interconnect design process.

Furthermore, electrical pad 304 may be considered either an inner electrical pad 304 (e.g., 304a, 304b, 304c) or an outer electrical pad 304 (e.g., 304d, 304e, 304f). An outer electrical pad will generally correspond (e.g., via coordinates) to an outer FC bump or an outer FC I/O pad, which is located closer to the edge of the corresponding die. On the other hand, an inner electrical pad will generally correspond (e.g., via coordinates) to an inner FC bump or an inner FC I/O pad, which is located relatively far from the edge of the corresponding die. The inner electrical pad will generally be behind another electrical pad (e.g., outer electrical pad 306b) that may block its electrical path routing. As such, an outer electrical pad will typically have escape route 306 (e.g., 306b) for connecting to a transmission line on a top substrate layer (e.g., 118a) whereas an inner electrical pad will typically have escape route 306a that traverses a plurality of layers for connection to a transmission line on an intermediate (e.g., 118b) or bottom substrate layer (e.g., 118c). Accordingly, this arrangement will facilitate maximum routing density on any particular substrate layer. Any technique or mechanism may be used for escape route 306a to traverse a plurality of substrate layers. For example, vias or interconnects may be used.

FC pad module 302 is generally a cell that may be predefined or generated as necessary in designing the electrical interconnects. FC pad module 302 may also include portions of more than one electrical path such that a plurality of electrical pads 304 and corresponding escape routes 306 are included. Furthermore, FC pad module 302 may be defined where electrical pads 304 and corresponding escape routes 306 share common constraints. Any suitable common constraint may be applied.

For example, the common constraint may include an electrical parameter such as polarity, propagation delay, impedance, or lump parameters such as RLC (resistance, inductance, capacitance) values. The common constraint may also include a geometrical parameter such as electrical path spacing (e.g., bump pitch; interconnect to interconnect spacing; trace to trace spacing; etc.) and electrical path thickness (e.g., cross sectional area). Electrical path thickness may be based on the layer stack-up and/or substrate technology. Another common constraint may simply be the minimum distance allowed between a signal electrical path and a power or ground electrical path. This common constraint may even be applied to designing electrical paths on different substrate layers. That is, if layer 1 is a signal plane, layer 2 may have to be a ground plane as opposed to another signal plane to avoid cross talking. Additionally, the common constraint may include a set ratio allocation of signal, power, or ground electrical paths amongst the plurality of electrical paths within FC pad module 302. For instance, setting the electrical path allocation ratio to eighty percent I/O signal and twenty percent for power and ground. Typically, the common constraint is based on a targeted performance (e.g., minimizing cross talking; maximizing routing density; other design considerations; etc.) and substrate technology.

In one embodiment, a worst-case scenario is used to further define the plurality of electrical paths within FC pad module 302. The worst-case scenario is based on any one electrical path within FC pad module 302 that would present the greatest limitation on the applied constraint. That is, each of the electrical paths within FC pad module 302 may be defined according to the one electrical path that produces the worst result among the plurality of electrical paths when the same constraint is equally applied to each of them.

Generally, a single FC pad module 306 will not be enough to account for all of the electrical interconnects of a substrate. However, a plurality of FC pad modules 306 can be aligned together to achieve just this. For example, aligning a plurality of FC pad modules 306 adjacent to one another so that any number of electrical interconnects can be accounted for. In one embodiment, every FC pad module 306 within the plurality of FC pad modules 306 is defined similarly. In another embodiment, differently defined FC pad modules 306 may be aligned together. For instance, FC pad modules 306 located on corners may be different from FC pad modules 306 located on the sides. In a preferred embodiment, the plurality of FC pad modules 306, whether defined similarly or differently, will still share a common constraint to ensure adequate alignment (e.g., minimized interference or crosstalk) between adjacent FC pad modules 306. Finally, any algorithm may be used in determining the number of FC pad modules 306 needed to adequately design the electrical interconnects.

Figure 3C:
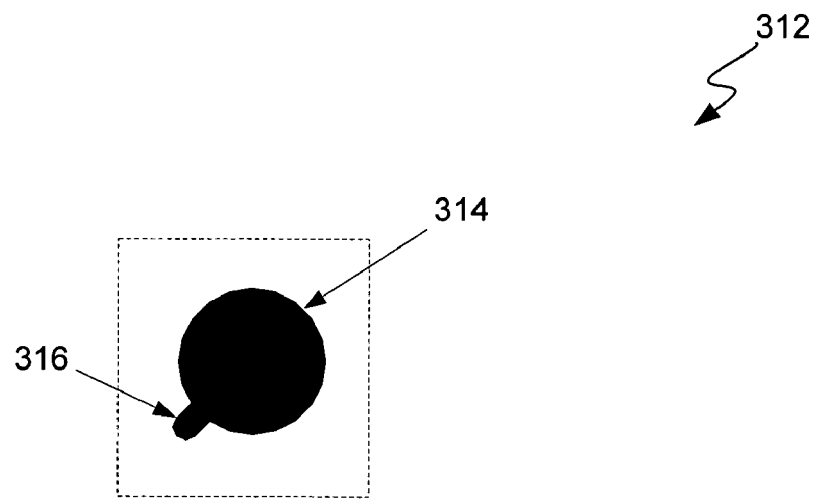
FIG. 3C illustrates a top view of a basic BGA land module according to various embodiments of the present invention.

On the other side of the electrical interconnect design, a top view of a basic BGA land module 312 according to various embodiments of the present invention is illustrated in FIG. 3C. BGA connection module 312 includes a portion of at least one electrical path having a BGA land 314 with an adjoining escape route 316 that extends to the edge of BGA land module 312 for connecting to a corresponding transmission line 322. BGA land 314 will correspond to coordinates of a BGA ball location for placement of BGA connection module 312. The coordinates of BGA ball locations will also be provided early in the electrical interconnect design process.

In general, BGA connection module 312 will have escape route 316 that terminates at one end on the same substrate layer (e.g., 118) as that of a corresponding escape route 306. Accordingly, a corresponding transmission line 322 can be routed also on the same substrate layer to connect the FC pad module 302 with the BGA connection module 312 at the corresponding escape routes 306 and 316. At the other end, escape route 316 will terminate at BGA land 314. In some embodiments, escape route 316 may traverse a plurality of layers for connection to BGA land 314. Any technique or mechanism may be used for escape route 316 to traverse the plurality of substrate layers.

Generally, BGA connection module 312 may be designed similarly to FC pad module 302. As such, many of the constraints used to define FC pad module 302 may also be used for defining BGA connection module 312. Furthermore, multiple BGA connection modules 312 can be aligned together to account for any number of electrical paths in the substrate.

As mentioned above, the coordinates of FC bump/I/O pad and BGA ball locations are provided early in the electrical interconnect design process. In one embodiment, the coordinates may be provided in a netlist or a separate report. For context, a netlist is generally the output of an electronic design as entered by the user for implementing onto a chip. Frequently, the netlist is produced from a Hardware Design Language (HDL) representation of the electronic design. Often that representation is provided in a Register Transfer Language (RTL), which specifies some level of hardware design. In another embodiment, the netlist provides information on which electrical pad 304 connects to which BGA land 314. As such, this information may be used for connecting transmission lines 322 there between (e.g., via connection to the corresponding escape routes 306 or 316).

Methodology for Designing a Plurality of Electrical Paths in a Substrate

According to the present invention, an electrical interconnect design methodology is provided by which standardization can be realized. The electrical interconnect design methodology of the present invention provides an approach to the design process that employs software design tools to produce an automated electrical interconnect design based on modular cells defined by constraints. The present invention provides a number of benefits with respect to conventional approaches due to the standardization of a modular electrical interconnect design. For example, a consistent electrical interconnect design can be achieved between different designers despite their levels of expertise. This in turn provides a consistent electrical interconnect design between different devices within a product family. Not only will an optimized electrical interconnect design (e.g., via the applied constraints) be achievable, the electrical interconnect design will possess electrical behaviors and performances that are more predictable. Moreover, the present invention provides the benefit of having shorter leadtimes for generating the electrical interconnect design and reduced overall production development cycle.

Figure 4:
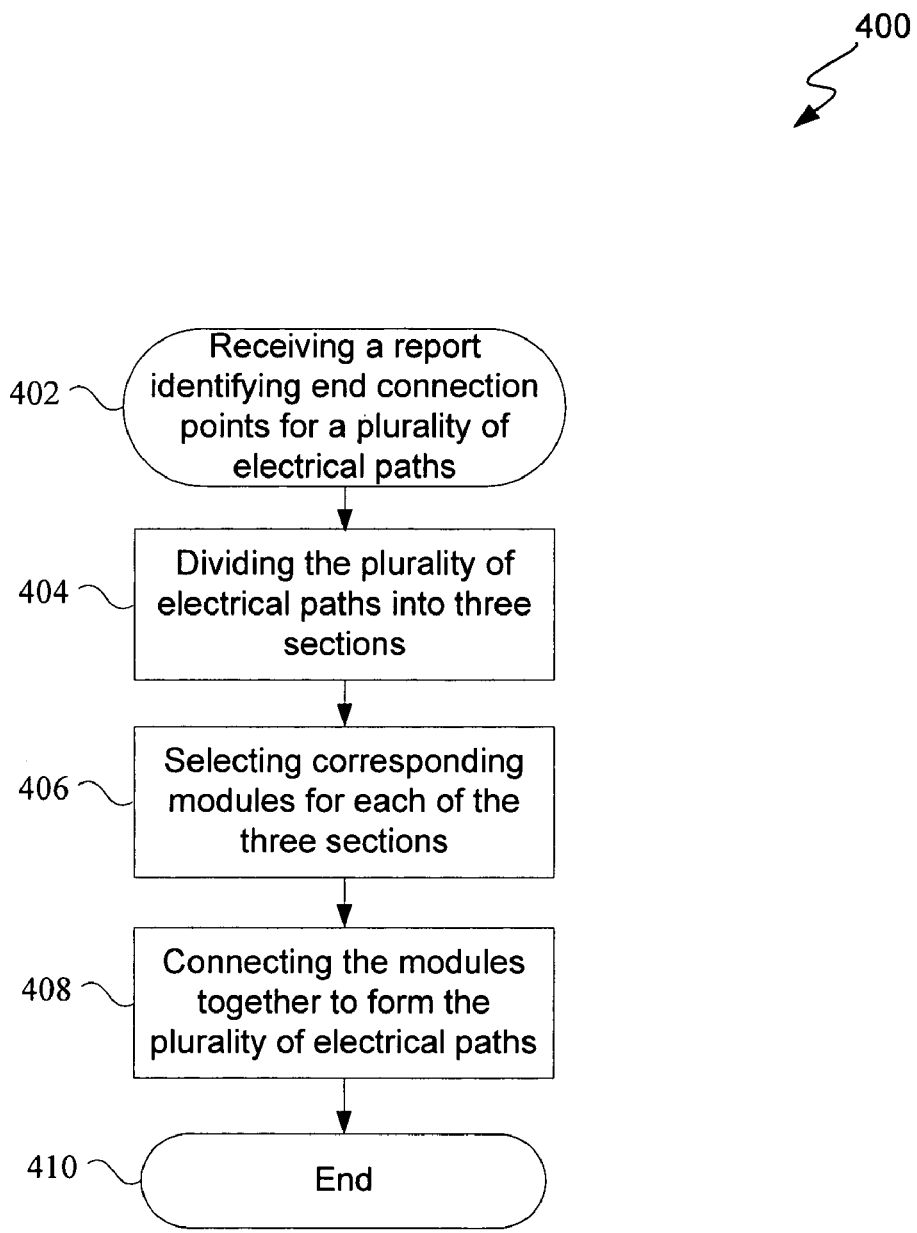
FIG. 4 illustrates a process flow diagram for designing the electrical interconnects in a substrate according to various embodiments of the present invention.

FIG. 4 illustrates a process flow diagram 400 for designing the electrical interconnects in a substrate according to various embodiments of the present invention. Although the specific example depicted is illustrative, it should not be construed as limiting the techniques of the present invention to any particular process flow. The techniques of the present invention provide mechanisms for allowing a standardized electrical interconnect design. In one example, the design of the electrical paths includes dividing the electrical paths into three sections. The two end sections have corresponding cells that contain standardized modules defined by common constraints. The intermediate section includes transmission lines that connect the corresponding cells of the two end sections in generating the electrical paths. The intermediate section may also be defined by common constraints as well as by the cells of the two end sections.

Referring to FIG. 4, process flow diagram 400 begins by receiving a report identifying end connection points (e.g., electrical pad 304; BGA land 314) for the plurality of electrical paths in operation 402. The plurality of electrical paths may include electrical paths for signal, power, or ground. In general, the report identifies which end connection points are interconnected. Furthermore, the report identifies a set of coordinates that correspond to a set of FC bump/I/O pad locations on the die, the set of coordinates being relative to the die. In one embodiment, the report is a netlist.

Next, the operation of dividing the plurality of electrical paths into three sections may be performed in operation 404. According to various embodiments, the three sections are a first end section (e.g., FC pad escape route), an intermediate section (e.g., transmission line route), and a second end section (e.g., BGA connection route). The first and second end sections include a portion of at least one electrical path that traverses the plurality of substrate layers. On the other hand, the intermediate section includes a portion of at least one electrical path that traverses across only one of the plurality of layers.

Afterwards, operation 406 may be performed for selecting cells for the first end section and the second end section, the cells being a first end cell (e.g., FC pad module) and a second end cell (e.g., BGA land module). In one embodiment, the first end cell includes a plurality of first end electrical paths defined by a common constraint. Each first end electrical path usually has one of the end connection points that corresponds to the set of coordinates. In another embodiment, the second end cell includes a plurality of second end electrical paths also defined by a common constraint. Each second end electrical path may include one of the end connection points that has a BGA ball coordinate relative to the set of coordinates.

Any common constraint may be implemented. For instance, the common constraint may include an electrical parameter such as polarity, propagation delay, impedance, or RLC. The common constraint may also include a geometrical parameter such as electrical path spacing and electrical path thickness. Additionally, the common constraint may include a set ratio of signal, power, or ground electrical paths amongst the plurality of first end electrical paths. Often the common constraint is predefined. For instance, FC pad module may include predefined power/ground pad(s) to I/O pad(s) ratio. However, the common constraint may also be definable by the designer. Typically, the common constraint is selected based on one of the plurality of electrical paths that produces the greatest limitation on the common constraint (e.g., worst-case scenario).

Next, connecting the cells together with transmission lines to form the plurality of electrical paths is performed in operation 408. Operation 408 may be performed manually by a designer or automatically by software. The transmission lines generally correspond with the portion of electrical paths within the intermediate section. In connecting the cells together, the process of aligning the first end cell, transmission lines, and second end cell is performed such that the first end, intermediate, and second end electrical paths form the electrical paths with corresponding end connection points that are consistent with the report. The transmission lines generally include a plurality of intermediate electrical paths also defined by a common constraint. In one embodiment, each intermediate electrical path is further defined by corresponding first end and second end electrical paths. Finally, process flow diagram 400 ends in operation 410.

Application

While the methods, apparatus, and computer program products of this invention are applicable to any electronic design or target hardware device, they find particular value in the context of programmable logic devices (PLDs). A PLD is a programmable integrated circuit that allows the user of the circuit, using software control, to customize the logic functions the circuit will perform. Examples of PLDs are FPGAs (Field Programmable Gate Arrays) and EPLDs (Erasable Programmable Logic Devices). The logic functions previously performed by small, medium and large-scale integration integrated circuits can instead be performed by programmable logic devices. As indicated, programmable logic devices supplied by integrated circuit manufacturers like Altera Corporation (a more detailed description of these products can be found at "www.altera.com") are not inherently capable of performing any specific function. The user, in conjunction with software supplied by the PLD manufacturer, can program the PLD to perform the specific function or functions required by the user's application. The PLD then can function in a larger system designed by the user, just as though dedicated logic chips were employed.

A typical PLD includes an array of logic cells that can be individually programmed and arbitrarily interconnected to each other to provide internal input and output signals, thus permitting the performance of complex combinational and sequential logic functions. The program is implemented in the PLD by setting the states of programmable elements such as memory cells. These memory cells may be implemented with volatile memories, such as SRAMs, which lose their programmed states upon termination of power to the system. If the programmable elements used are volatile memories, the memory cells must be configured upon each system power-up in order to configure the PLD.

The foregoing describes the instant invention and its presently preferred embodiments. Numerous modifications and variations in the practice of this invention are expected to occur to those skilled in the art. For instance, the present invention may be used on any substrate with any number of electrical paths. Although many of the components and processes are described above in the singular for convenience, it will be appreciated by one of skill in the art that multiple components and repeated processes can also be used to practice the techniques of the present invention. Therefore, the described embodiments should be taken as illustrative and not restrictive, and the invention should not be limited to the details given herein but should be defined by the following claims and their full scope of equivalents.

What is claimed is:

1. A method for designing a plurality of electrical paths in a substrate used for coupling to a die, the substrate having a plurality of layers, the method comprising:
   receiving a report identifying end connection points for the plurality of electrical paths;
   dividing the plurality of electrical paths into sections including a first end section, an intermediate section, and a second end section;
   selecting modular cells for the first end section and the second end section, the modular cells being a first end modular cell having a plurality of first end electrical paths defined by a first common constraint and a second end modular cell having a plurality of second end electrical paths defined by a second common constraint;
   selecting the first common constraint based on one of the plurality of first end electrical paths having the greatest limitation on the first common constraint; and
   connecting the first end modular cell to the second end modular cell with transmission lines to form the plurality of electrical paths, the transmission lines corresponding to the intermediate section.

2. The method of claim 1, wherein the report identifies which end connection points are interconnected.

3. The method of claim 2, wherein the report also identifies a set of coordinates that corresponds to a set of I/O pad locations on the die.

4. The method of claim 3, wherein the plurality of electrical paths is selected from the group consisting of signal, power, and ground electrical paths.

5. The method of claim 2, wherein the report is a netlist.

6. The method of claim 2, wherein the first and second end sections include a portion of at least one electrical path that traverses the plurality of layers.

7. The method of claim 2, wherein the intermediate section includes a portion of at least one electrical path that traverses only one of the plurality of layers.

8. The method of claim 1, wherein connecting comprises:
   automatically aligning the first end modular cell, transmission lines, and second end modular cell such that the first end, intermediate, and second end electrical paths form the electrical paths with corresponding end connection points that are consistent with the report.

9. The method of claim 1 further comprising:
   selecting the second common constraint based on one of the plurality of second end electrical paths having the greatest limitation on the second common constraint.

10. A method for designing a plurality of electrical paths in a substrate used for coupling to a die, the substrate having a plurality of layers, the method comprising:
    receiving a report identifying end connection points for the plurality of electrical paths and identifying a set of coordinates that correspond to a set of I/O pad locations on the die, the set of coordinates being relative to the die, the plurality of electrical paths including signal, power, and ground electrical paths;
    dividing the plurality of electrical paths into three sections including a first end section, an intermediate section, and a second end section;
    selecting a first end modular cell and a second end modular cell associated with the first and second end sections, wherein the first end modular cell comprises a plurality of first end electrical paths defined by a common constraint, wherein each first end electrical path includes one of the end connection points that corresponds to the set of coordinates;

selecting the common constraint based on one of the plurality of first end electrical paths having the greatest limitation on the common constraint; and connecting the first end and second end modular cells with transmission lines to form the plurality of electrical paths, the transmission lines corresponding with the intermediate section.

11. The method of claim 10, wherein the common constraint is predefined.

12. The method of claim 10, wherein the common constraint comprises an electrical parameter.

13. The method of claim 12, wherein the electrical parameter is selected from the group consisting of polarity, propagation delay, impedance, and RLC.

14. The method of claim 10, wherein the common constraint comprises a geometrical parameter.

15. The method of claim 14, wherein the geometrical parameter is selected from the group consisting of electrical path spacing and electrical path thickness.

16. The method of claim 10, wherein the common constraint comprises a set ratio of signal, power, or ground electrical paths amongst the plurality of first end electrical paths.

17. The method of claim 10, wherein the second end modular cell comprises a plurality of second end electrical paths defined by a second common constraint, wherein each second end electrical path includes one of the end connection points that has a BGA coordinate relative to the set of coordinates.

18. The method of claim 17, wherein the second common constraint is predefined.

19. The method of claim 17, wherein the second common constraint comprises a geometrical parameter.

20. The method of claim 19, wherein the geometrical parameter is selected from the group consisting of electrical path spacing and electrical path thickness.

21. The method of claim 17, wherein the second common constraint comprises a set ratio of signal, power, or ground electrical paths amongst the plurality of second end electrical paths.

22. The method of claim 17, wherein the transmission lines comprise a plurality of intermediate electrical paths defined by a third common constraint, wherein each intermediate electrical path is further defined by corresponding first end and second end electrical paths.

23. The method of claim 22, wherein the third common constraint is predefined.

24. The method of claim 22, wherein the third common constraint comprises a geometrical parameter.

25. The method of claim 24, wherein the geometrical parameter is selected from the group consisting of electrical path spacing and electrical path thickness.

26. A method for designing a plurality of electrical paths in a substrate used for coupling to a die, the substrate having a plurality of layers, the method comprising:

receiving a report identifying end connection points for the plurality of electrical paths and identifying a set of coordinates that correspond to a set of I/O pad locations on the die, the set of coordinates being relative to the die, the plurality of electrical paths including signal, power, and ground electrical paths;

dividing the plurality of electrical paths into three sections including a first end section, an intermediate section, and a second end section;

selecting a first end cell and a second end cell associated with the first and second end sections, wherein the first end cell comprises a plurality of first end electrical paths defined by a common constraint, each first end electrical path includes one of the end connection points that corresponds to the set of coordinates, wherein the second end cell comprises a plurality of second end electrical paths defined by a second common constraint, each second end electrical path includes one of the end connection points that has a BGA coordinate relative to the set of coordinates, wherein the second common constraint is selected based on one of the plurality of second end electrical paths having the greatest limitation on the second common constraint; and connecting the first end and second end cells with transmission lines to form the plurality of electrical paths, the transmission lines corresponding with the intermediate section.

27. The method of claim 17, wherein the second common constraint comprises an electrical parameter.

28. The method of claim 27, wherein the electrical parameter is selected from the group consisting of polarity, propagation delay, impedance, and RLC.

* * * * *